United States Patent
Wolber et al.

(10) Patent No.: US 7,015,688 B2
(45) Date of Patent: Mar. 21, 2006

(54) DEVICE FOR ADJUSTMENT OF ROTATION ANGLES

(75) Inventors: Ralph Wolber, Spaichingen (DE); Rainer Kizele, Tuttlingen (DE); Wolfgang Haeussler, Rottweil (DE); Peter Bachmann, Trossingen (DE)

(73) Assignee: Marquardt GmbH, Rietheim-Weilheim (DE)

( * ) Notice: Subject to any disclaimer, the term of this patent is extended or adjusted under 35 U.S.C. 154(b) by 90 days.

(21) Appl. No.: 10/647,121

(22) Filed: Aug. 25, 2003

(65) Prior Publication Data

US 2004/0257068 A1 Dec. 23, 2004

Related U.S. Application Data

(63) Continuation of application No. PCT/DE02/00658, filed on Feb. 22, 2002.

(30) Foreign Application Priority Data

Feb. 24, 2001 (DE) ................ 101 09 037
Feb. 24, 2001 (DE) ................ 101 09 038

(51) Int. Cl.
*G01B 7/14* (2006.01)
*G01B 7/30* (2006.01)
*G01R 33/06* (2006.01)
*H01L 43/06* (2006.01)

(52) U.S. Cl. ................ 324/207.2; 324/207.25
(58) Field of Classification Search ............ 324/207.2, 324/21, 207.25, 207.23, 207.12, 207.13, 324/202, 207.21; 33/1 PT, 1 N; 341/35; 200/564, 565, 19.07, 336; 338/32 R, 32 H
See application file for complete search history.

(56) References Cited

U.S. PATENT DOCUMENTS

| 3,988,710 A | 10/1976 | Sidor et al. |
| 4,054,860 A | 10/1977 | Henderson et al. |
| 4,054,861 A | 10/1977 | Markison |
| 4,114,001 A * | 9/1978 | Corfield ............... 200/50.06 |
| 4,199,741 A | 4/1980 | Serrus Paulet |

(Continued)

FOREIGN PATENT DOCUMENTS

DE    2 242 354 A    3/1974

(Continued)

OTHER PUBLICATIONS

R. Steiner et al., "In-plane Sensitive Vertical Trench-hall Device," Electron Devices Meeting, 1998, IEDM., Technical Digest, pp. 479-482.

*Primary Examiner*—Bot Ledynh
*Assistant Examiner*—Kenneth J. Whittington
(74) *Attorney, Agent, or Firm*—Venable LLP; Robert Kinberg; Thomas G. Wiseman

(57) ABSTRACT

A device for adjusting rotation angles, e.g. an electrical rotary switch (1), has a stator (2) and a rotator (3) mounted on the stator (2). The rotator (3) rotates between at least two rotational angle positions. The device has a magnet (4), e.g. a permanent magnet, which can be moved by the rotor (3), and a magnet field sensor (5), e.g. a Hall sensor, which together with the magnet (4) produces a signal which corresponds to the rotational angle position. The stator (2) has a receptacle (8) open on one side and shaped like a pot, with the receptacle (8) forming a rotating bearing for the rotator (3). The magnetic field sensor (5) is arranged in the receptacle (8) on the stator (2) and/or on a part which is mounted on the stator (2), such that the stator is a mount for the magnet field sensor (5).

36 Claims, 4 Drawing Sheets

U.S. PATENT DOCUMENTS

| | | | | |
|---|---|---|---|---|
| 4,415,856 A | * | 11/1983 | Welles | 324/207.25 |
| 4,843,196 A | * | 6/1989 | Bissig et al. | 200/336 |
| 4,970,512 A | * | 11/1990 | Wood | 341/35 |
| 5,497,081 A | * | 3/1996 | Wolf et al. | 324/207.12 |
| 5,512,820 A | * | 4/1996 | Alfors | 324/207.22 |
| 5,592,079 A | * | 1/1997 | Scheel | 324/207.25 |
| 5,627,465 A | * | 5/1997 | Alfors et al. | 324/207.2 |
| 5,644,225 A | | 7/1997 | Alfors et al. | |
| 5,742,160 A | | 4/1998 | Bergstedt et al. | |
| 6,188,332 B1 | | 2/2001 | Scarlata | |
| 6,223,571 B1 | * | 5/2001 | Rector | 70/276 |
| 6,236,002 B1 | * | 5/2001 | Chou | 200/4 |
| 6,242,909 B1 | * | 6/2001 | Dorsey et al. | 324/207.25 |
| 6,252,394 B1 | * | 6/2001 | Roze et al. | 324/207.12 |
| 6,316,935 B1 | * | 11/2001 | Vanzuilen | 324/207.21 |
| 6,365,424 B1 | * | 4/2002 | Bauer et al. | 438/15 |
| 6,373,241 B1 | * | 4/2002 | Weber et al. | 324/207.2 |
| 6,404,354 B1 | * | 6/2002 | Decker et al. | 341/35 |
| 6,445,178 B1 | * | 9/2002 | Hoekstra | 324/207.12 |
| 6,518,753 B1 | * | 2/2003 | Apel et al. | 324/207.25 |
| 6,720,513 B1 | * | 4/2004 | Fleissner et al. | 200/336 |

FOREIGN PATENT DOCUMENTS

| | | |
|---|---|---|
| DE | 24 46 193 A1 | 4/1976 |
| DE | 29 20 084 A1 | 11/1980 |
| DE | 43 11 496 C2 | 10/1994 |
| DE | 44 05 910 A1 | 9/1995 |
| DE | 196 36 159 A1 | 3/1998 |
| DE | 198 57 017 A1 | 6/1999 |
| DE | 200 02 719 U1 | 6/2000 |
| DE | 199 29 200 A1 | 12/2000 |
| EP | 0 699 295 B1 | 3/1996 |
| WO | 0 781 980 A1 | 7/1997 |
| WO | WO 98/54547 A1 | 12/1998 |
| WO | WO 99/35768 A1 | 7/1999 |
| WO | WO 00/58986 A1 | 10/2000 |

* cited by examiner

DEVICE FOR ADJUSTMENT OF ROTATION ANGLES

CROSS-REFERENCE TO RELATED APPLICATION

This application is a continuation of International Application No. PCT/DE02/00658, filed on Feb. 22, 2002, designating the United States, and claiming priority with respect to German application No. 101 09 037.4 filed Feb. 24, 2001, the subject matter of both foregoing applications being incorporated herein by reference.

The invention relates to a device for adjusting rotation angles.

Devices such as these for adjusting rotation angles are used as rotation angle encoders in which electrical signals which are associated with the respective rotation angle setting are produced. A rotation angle encoder such as this with a handle for manual adjustment of the rotation angle can also be used, by suitable measures, as an electrical rotary switch.

A device which is in the form of an electrical rotary switch for adjusting rotation angles is known from U.S. Pat. No. 4,054,860. This device has a stator and a rotor which is mounted on the stator such that it can rotate. Magnets are located on the rotor, to be precise permanent magnets, by which means the magnets can be moved by means of the rotor. Magnetic field sensors which face the magnets, to be precise Hall sensors, are arranged on a mount on the device. The rotor can be moved between two or more rotation angle positions, such that the magnetic field sensors produce a signal, which corresponds to the respective rotation angle position, on the basis of the magnetic field that is caused by the magnets.

In one exemplary embodiment in U.S. Pat. No. 4,054,860, the stator has a receptacle which is open on one side and is approximately in the form of a pot. The receptacle is used as a rotary bearing for the rotor. The magnetic field sensors are located on a printed circuit board, which is in turn mounted in the receptacle. The stator is thus also used as a mount for the magnetic field sensors.

A comparable key-operated switch which is used as an ignition lock for a construction machine, is disclosed in WO 00/58 986 A. A magnetic sensor which operates on the Hall principle and is produced as a chip using CMOS technology is described in the publication by Steiner, R. et al., "In-Plane Sensitive Vertical Trench-Hall Device", ELECTRON DEVICES MEETING, 1998, IEDM '98 TECHNICAL DIGEST., INTERNATIONAL SAN FRANCISCO, Calif., USA 6–9 Dec. 1998, PISCATAWAY; N.J., USA, IEEE, US, Dec. 6, 1988, pages 479 to 482. This magnetic sensor is sensitive parallel to its two-dimensional chip surface. However, the scientific publication does not disclose any more details relating to the arrangement of a magnetic sensor such as this in a rotary switch.

One disadvantage that has been found with these known devices is their complexity, which leads to a rotary switch which is expensive and susceptible to faults. These devices therefore require two or more magnets and two or more magnetic field sensors. An additional mount is required for the arrangement of the magnetic field sensors. Overall, this is thus also a physically large rotary switch, which cannot be used in compact electrical appliances. In particular, a rotary switch such as this is not suitable for arrangement on a printed circuit board which holds the electronics for evaluation of the signals from the magnetic field sensors in a control panel on an electrical appliance, such as a washing machine or dishwasher.

Furthermore, the documents which relates to these rotary switches contain no information relating to tolerance problems during assembly or the like, which can lead to corruption of the signals which are produced by the magnetic sensors when the rotor is in the initial position. In addition, manufacturing processes mean that the magnetic field sensor (which is an integrated semiconductor circuit) is also subject to tolerances in the signals that are produced. The known rotary switch is thus just as unsuitable for automotive mass production.

U.S. Pat. No. 5,644,225 A admittedly discloses calibration of a device for measuring rotation angles, which has a permanent magnet and a magnetic sensor. There, the calibration process is carried out in a complex manner by applying a corresponding additional magnetic field to the permanent magnet to magnetize it. This type of calibration thus appears to be rather unsuitable for a physically small rotary switch.

The invention is based on the object of providing a device for adjusting rotation angles which is suitable for being arranged in a simple manner on a printed circuit board, for example on a control panel or the like, and which in particular is physically small. Furthermore, the device can be designed so as to allow compensation for the tolerances after assembly, in particular in a simple manner.

For a device of this generic type for adjusting rotational angles, this object is achieved by the location of the magnet on the rotation axis of the rotor, the use of a Hall sensor which is two-dimensionally sensitive for magnetic fields parallel to its chip surface, and the location of the Hall sensor on the side of the receptacle, which faces away from the open side, in addition, the adjustability of the magnet with respect to the rotor, when the rotor is in one rotation angle position.

In the case of the device according to the invention, which in particular is in the form of an electrical rotary switch, the stator has a receptacle which is open on one side and is in particular approximately in the form of a pot, which forms a rotary bearing for the rotor. Furthermore, the magnet is in the form of a two-dimensionally, diametrically magnetized permanent magnet and is arranged on the rotation axis of the rotor. The magnetic field sensor is in the form of a Hall sensor which is two-dimensionally sensitive for magnetic fields parallel to its chip surface, and is mounted on that side of the receptacle which faces away from the open side. The magnetic field sensor is in this case arranged in the receptacle on the stator and/or on a part which is mounted in the stator, as a result of which, in addition to its function as a rotating bearing for the rotor, the stator is at the same time used as a mount for the magnetic field sensor. The stator is thus a multifunction component in which two or more functionalities, which were previously provided separately, of the device are integrated, namely acting as a mount, as a rotating bearing, and, possibly, as a housing.

In the case of the device according to the invention, the magnet can likewise be arranged such that it can be moved in order to adjust its position with respect to the rotor, thus allowing adjustment of the position of the magnet in one rotation angle position of the rotor, with respect to the signal which is produced by the magnetic field sensor. Thus, during the adjustment process, the mechanical null point as defined by the rotor can be linked to the electrical null point of the device, as defined by the magnetic field sensor.

Further refinements of the invention follow.

The stator and/or the rotor may be composed of plastic, in particular of a thermoplastic. For example, polyamide may be chosen for this purpose. The stator and/or the rotor are then expediently produced as an injection-molded part, so that these components can be produced in a simple and cost-effective manner.

The device for adjusting the rotation angles can be designed to be particularly compact by the rotor being essentially, in particular completely, located in the receptacle. In this refinement, a surface of the receptacle which is located in the interior of the stator acts in a direct manner as a rotating bearing. In order to secure the rotor in the receptacle such that it cannot fall out, interacting latching elements can be provided in the receptacle, between the stator and the rotor. The magnetic field sensor may be mounted on that side of the receptacle which faces away from the open side, that is to say on the lower face of the stator.

The conductor tracks for electrical connection of the magnetic field sensor can be arranged in a space-saving manner in the stator, with the conductor tracks expediently extending into the receptacle. The magnetic field sensor can then be soldered, welded, adhesively bonded by means of a conductive adhesive or the like directly to the conductor tracks, such that the conductor tracks at the same time become the part that is mounted on the stator, for arrangement of the magnetic field sensor. If the magnetic field sensor is an encapsulated chip with connections, then the connections can in this case be soldered to the conductor tracks in order to make electrical contact. To simplify the processes involved, the chip may be in the form of an SMD (Surface Mounted Device) component. If the magnetic field sensor is an unencapsulated chip, then the bonding wires, which in particular are welded to the chip, can be used to make electrical contact with the conductor tracks.

It is cost-effective for the conductor tracks to be in the form of a stamped grid composed of metal. The stamped grid can then be directly injected into the plastic for the injection-molded part in one process during the production of the stator. Alternatively, the conductor tracks can also be incorporated in the stator in the form of an MID (Molded Interconnected Device) component. This may be done, for example, by using metalized plastic for the conductor tracks.

In order to save a separate housing, the exterior of the stator can be in the form of a housing. The mounting of the device for adjusting rotation angles can be simplified by arranging latching and/or snap-action hooks on the housing in order to mount the stator on a holder. The open side of the receptacle in the stator expediently faces the holder, so that the holder covers the opening of the stator and at the same time forms a housing closure. It is particularly advantageous with regard to the costs and compactness for the holder to be a printed circuit board. The conductor tracks in the stator can then make contact with associated conductor tracks on the printed circuit board, that is to say the electrical connection for the rotary switch is made via the printed circuit board. It is also possible for an electronic device to be arranged on the printed circuit board, in order to evaluate the signals which are produced by the magnetic field sensor. The printed circuit board can if required also be provided with a panel for an electrical appliance or the like, so that the rotary switch according to the invention is suitable for direct arrangement in a simple manner on the panel of an electrical appliance.

In order to operate the rotary switch ergonomically, the rotor may have a recess, into which a handle can be inserted, on the open side of the receptacle. By way of example, it may be possible to rotate the handle manually by means of a shaft. If the handle is located on that side of the holder which faces away from the housing, then an opening which corresponds to the open side of the receptacle in the stator can be located in the holder, through which opening the shaft passes for insertion into the recess.

Particularly in the case of a device which is used as an electrical rotary switch, the rotation angle positions of the rotor are preferably in the form of latching positions, thus making it possible to achieve unambiguous switch positions in an ergonomic manner. The rotary switch emits, in particular, signal voltages. It may thus be advantageous for an electrical switch with a conventional electromechanical contact system to be additionally located in the housing of the rotary switch, as a mains switch, so that the rotary switch, at the same time may also switch the mains voltage. A rotary switch such as this can be used universally in an electrical appliance.

As already mentioned, adjustment can be provided in order to compensate for tolerances which may occur during the production of the device according to the invention for adjusting rotation angles. The adjustment process can be carried out in a particularly simple manner for subsequently setting the magnet to the initial position if the magnet is mounted on the rotor such that it can rotate. A receptacle is expediently provided for this purpose in the rotor, facing the magnetic field sensor. In addition, an adjustment means for adjusting the position of the magnet can be arranged between the magnet and the rotor, in order in this way to ensure a reproducible adjustment capability using simple means. It is possible for the adjusting means to be in the form of an intermediate piece which is mounted in the receptacle on the rotor such that it can rotate, with the magnet itself being mounted on the intermediate piece.

Despite its adjustment capability, the device for adjusting rotation angles can be designed to be particularly compact by making the magnet accessible for adjustment from the outside of the stator. Access can be provided via a receptacle in the stator, which is open on one side and is used as a rotating bearing for the rotor. An aperture is then expediently located in the rotor, extending from that surface of the rotor which faces the open side of the receptacle to the magnet and/or to the intermediate piece. For fine adjustment, a type of Torx, cruciform slot or similar receptacle can be located in the magnet and/or in the intermediate piece, facing the aperture. This allows the adjustment to be carried out via the aperture by means of a tool which engages in the receptacle, for example by means of a screwdriver.

In order to secure the adjusted position of the magnet, this can be connected to the rotor such that it cannot rotate. This can be done by adhesively bonding, welding, casting the magnet and/or the intermediate piece to the rotor, or fixing them in some other way, after adjustment.

The magnet is produced from a material which has magnetic particles and plastic in a refinement which is compact and is also cost-effective because it saves components. This material is molded, to be precise by means of injection-molding, in the form of a body such that the body at the same time represents the intermediate piece and the magnet.

The advantages which are achieved by the invention are, in particular, that the stator is in the form of a single component, with two or more functionalities at the same time. Furthermore, there is no need for any separate component for holding the sensor, for example the printed circuit board that is conventionally used. This results in assembly advantages, in particular allowing the device to be manufactured in an automated manner. Furthermore, the device can be physically very small, thus allowing for it to be used even in constricted spaces. Finally, the cost of the device is also lower than that of conventional devices.

Furthermore the direct placing of the magnetic field sensor on the stator results in a reduction in the tolerance chain. All the mechanical tolerances that occur between the magnetic field sensor and the magnet are eliminated. If required, the magnet can be adjusted for this purpose, during which process the mechanical null point of the device is linked to its electrical null point. This results in a defined initial situation which makes it possible to distinguish reliably between a greater number of rotation angle positions or switching positions. Thus, despite being physically compact, the device has more rotation angle positions than a conventional device, and can thus satisfy more stringent requirements, as well.

Exemplary embodiments of the invention together with various developments and refinements will be described in more detail in the following text and are illustrated in the drawings, in which:

FIG. 1 shows a device for adjusting rotation angles, and which is used primarily as an electrical rotary switch 1. A rotary switch 1 such as this may, for example, be arranged as a program selector switch in the panel of an electrical domestic appliance, such as a washing machine, a dishwasher or the like.

Figure 1:
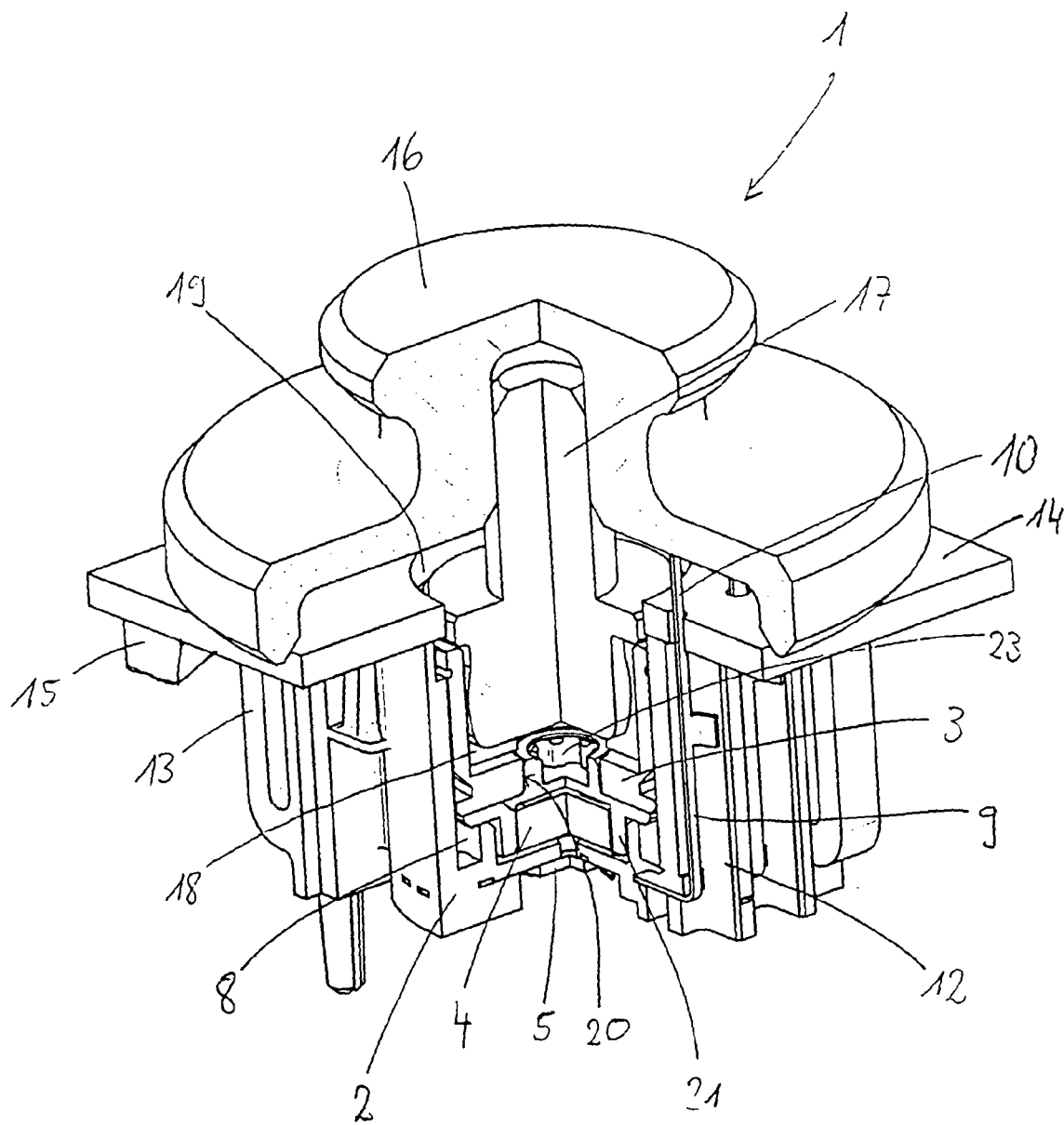
FIG. 1 shows a device, in the form of a rotary switch, for adjusting rotation angles in the form of a perspective view and partially sectioned.

The rotary switch 1 has a stator 2 as well as a rotor 3 which is mounted on the stator 2 such that it can rotate. A magnet 4 can be moved by means of the rotor 3. The magnet 4 has an associated magnetic field sensor 5. In particular, the magnet 4 is a cylindrical permanent magnet, which is preferably magnetized two-dimensionally, diametrically, that is to say one half cylinder, which has a semicircular cross section, represents the north pole, and the other half cylinder represents the south pole of the magnet. The magnetic field sensor is, in particular, a Hall sensor which is preferably sensitive in two dimensions for magnetic fields parallel to the chip surface of the Hall sensor. The rotor 3 can be moved between at least two rotation angle positions, thus varying the magnetic field which is produced by the magnet 4 in the area of the magnetic field sensor 5, so that the magnetic field sensor 5 produces a signal which corresponds to the respective rotation angle position.

Figure 2:
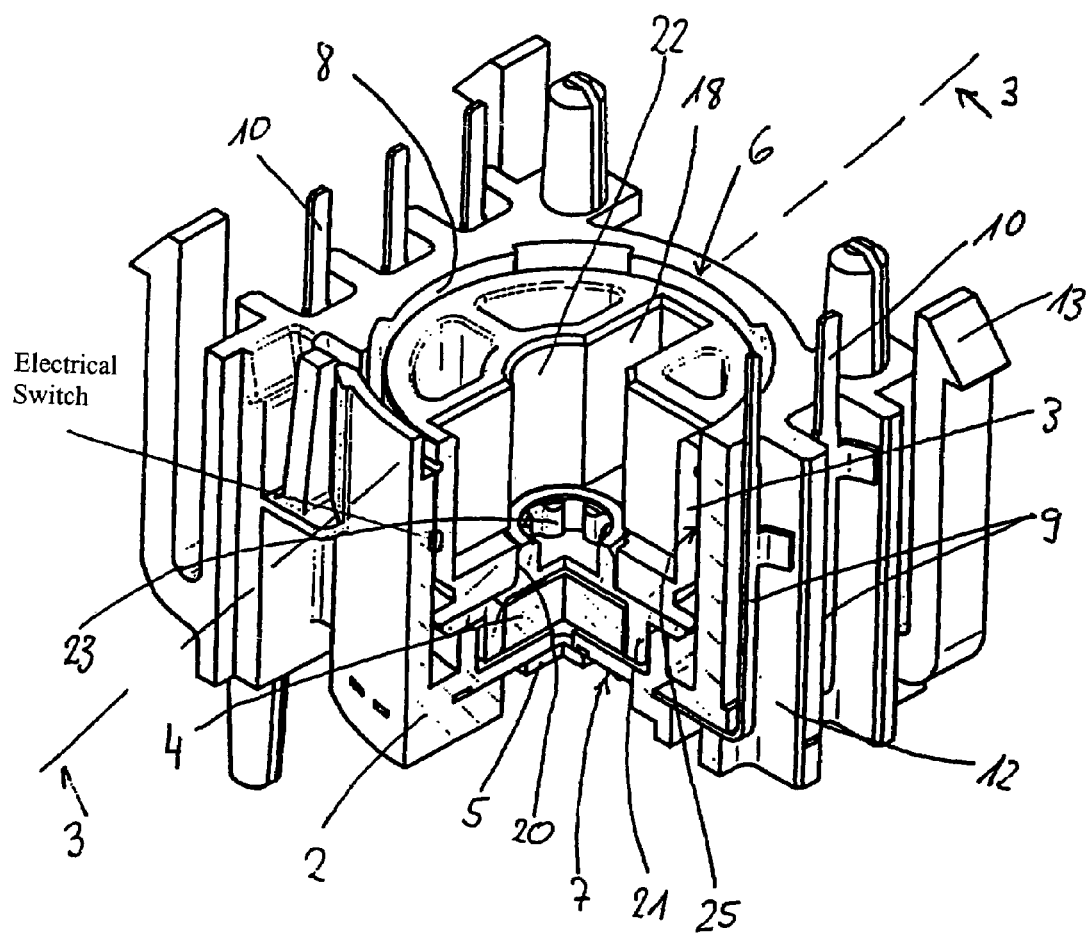
FIG. 2 shows the stator as an individual part from FIG. 1.
Figure 3:
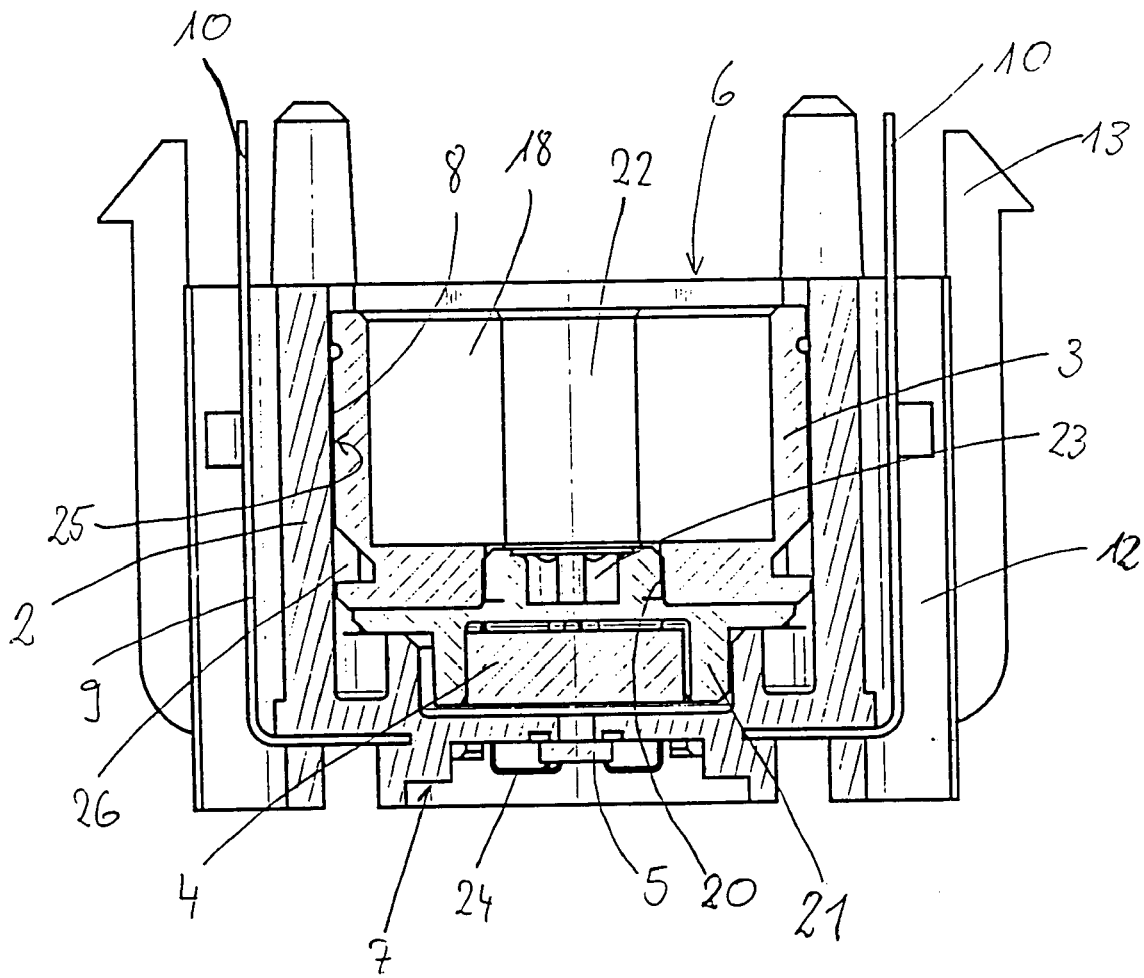
FIG. 3 shows a section along the line 3—3 from FIG. 2.

According to the invention, the stator 2 has a receptacle 8 which is open on one side 6 and is approximately in the form of a pot, as can be seen from FIG. 2 or 3. The receptacle 8 forms a rotating bearing for the rotor 3. The magnetic field sensor 5 is arranged in the receptacle 8, directly on the stator 2 and/or on the part which is mounted in the stator 2. Since the magnetic field sensor 5 is mounted on the stator 2, the stator 2 at the same time acts as a mount for the magnetic field sensor 5, thus avoiding the mounting plate which would otherwise normally be used for the magnetic field sensor in the switch. Furthermore, the stator 2 also carries out the function of the rotating bearing for the rotor 3 and, if required, also carries out the housing function.

Various developments and further refinements of the rotary switch 1 will be explained in more detail in the following text.

The magnetic field sensor 5 is mounted on that side 7 of the receptacle 8 which faces away from the open side 6. The rotor 3 is essentially located in the receptacle 8, as can be seen from FIG. 1. For the sake of compactness, the rotor 3 may be located completely within the receptacle 8. One surface 25 of the receptacle 8 which is located in the interior of the stator 2 then acts as a rotary bearing. In order to secure the rotor 3 such that it cannot fall out of the receptacle 8, interactive latching elements 26, as shown in FIG. 3, can be provided between the stator 2 and the rotor 3. Furthermore, integrated conductor tracks 9 may also be located in the stator 2, for electrical connection of the magnetic field sensor 5 to external connections 10 on the rotary switch 1. The conductor tracks 9 extend into the receptacle 8. The stator 2 is thus advantageously in the form of a multifunction part, which not only holds both the rotor 3 and the magnetic field sensor 5 but also provides the electrical connection for the magnetic field sensor 5.

The stator 2 and/or the rotor 3 are/is composed of plastic, to be precise a thermoplastic. By way of example, this may be polyamide. The stator 2 and/or the rotor 3 are/is expediently produced as an injection-molded part. In one refinement, the conductor tracks 9 are in the form of a stamped grid composed of metal. The stamped grid can then be sprayed into the plastic for the injection-molded part during the production of the stator 2. In this case, the magnetic field sensor 5 may also be supported by the robust stamped grid, so that these conductor tracks 9 then form the part which is mounted in the stator 2 for arrangement of the magnetic field sensor 5. In another refinement, the conductor tracks 9 are incorporated in the stator 2 in the form of an MID (Molded Interconnected Device) component. For example, the conductor tracks may in this case be formed from metalized plastic, which is also injected during the production of the injection-molded part for the stator 2, and/or which is subsequently electrochemically treated with metal.

Figure 4:
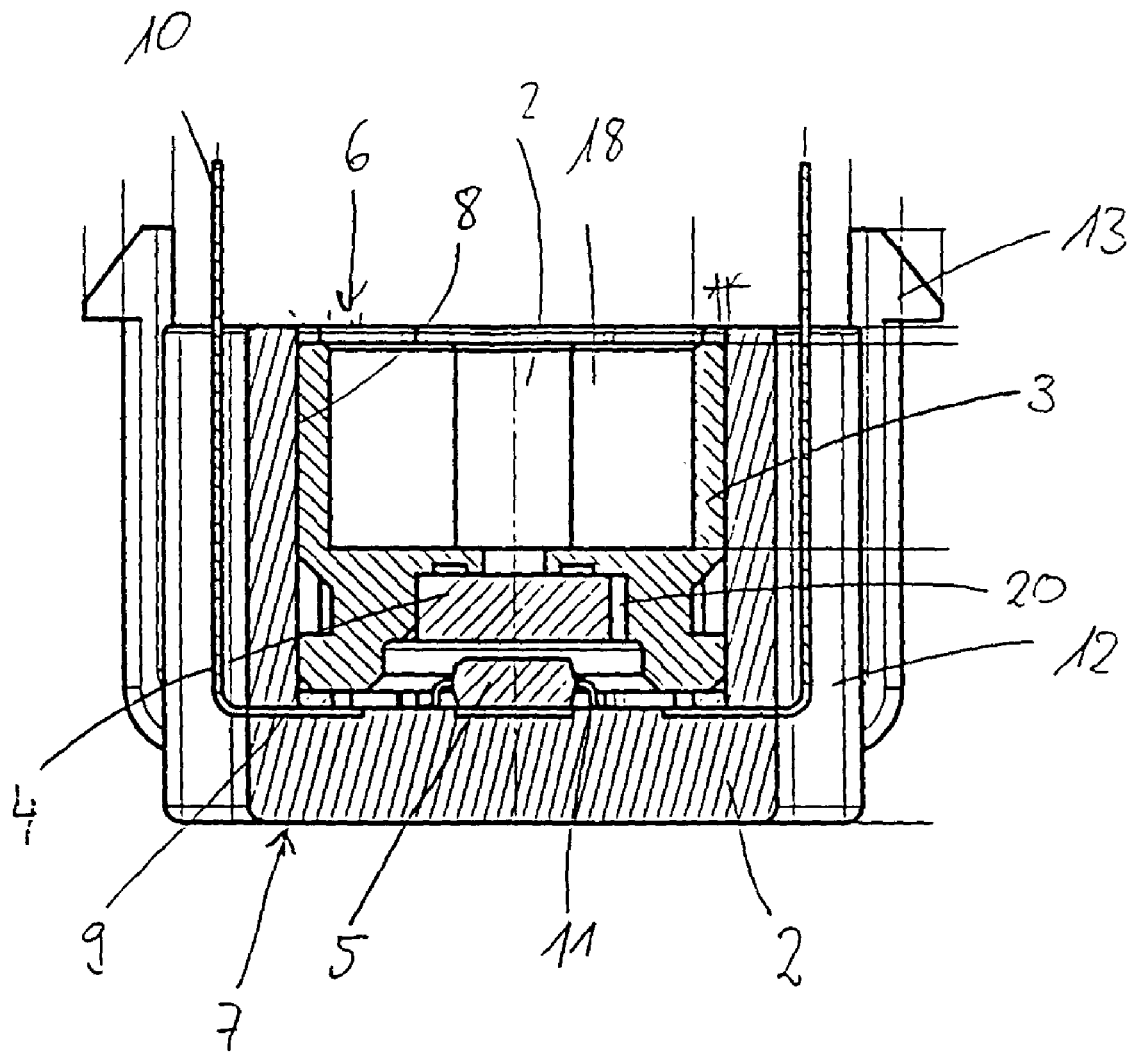
FIG. 4 shows a section as in FIG. 3, corresponding to a different refinement.

As can be seen in FIG. 4, the magnetic field sensor 5 is in the form of an encapsulated chip, to be precise in the form of an SMD (Surface Mounted Device) component. The chip has connections 11, which are in turn soldered to the conductor tracks 9 in order to make electrical contact. The magnetic field sensor 5 may also just as well be in the form of an unencapsulated chip, as is shown in FIG. 3. In this case, bonding wires 24 are used to make electrical contact with the conductor tracks 9, and are welded at one end to the chip and at the other end to the conductor track 9. The last-mentioned case offers in particular space-saving advantages over an encapsulated chip, so that the rotary switch 1 may be designed to be even more compact.

The exterior of the stator 2 may be designed in the form of a housing 12, as can be seen in more detail in FIG. 2. Latching and/or snap-action hooks 13 for mounting the stator 2 on a holder 14, which is shown in FIG. 1, are arranged on the housing 12. The open side 6 of the receptacle 8 in the stator 2 may expediently face the holder 14. The holder 14 is a printed circuit board, with the conductor tracks 9 in the stator 2 making contact via the electrical connections 10 with associated conductor tracks on the printed circuit board. An electronic device 15, which is indicated only schematically in FIG. 1, may be located on the printed circuit board, in order to evaluate the signals which are produced by the magnetic field sensor 5. The printed circuit board, which is in the form of the holder 14, can also be provided with a panel for an electrical appliance or the like. If required, the holder 14 may itself also be used as a panel for the appliance.

As can be seen from FIG. 1, the rotary switch 1 is equipped with a handle 16 as an operating device. The handle 16 allows the rotor 3 to be rotated manually. The handle 16 has a shaft 17 which is used for insertion of the handle 16 into a recess 18 which can be seen in FIG. 2 and is located on the open side 6 of the receptacle 8 in the rotor 3. The handle 16 is preferably located on that side of the holder 14 which faces away from the housing 12. An opening 19 which corresponds to the open side 6 of the receptacle 8 in the stator 2 is then located in the holder 14. The shaft 17 passes through this opening 19, for insertion into the recess 18.

A latching system, which is not shown in any more detail, for the switching position of the rotary switch 1 can be provided in the panel on the electrical appliance, in which panel the handle 16 is arranged. However, the switching positions of the rotary switch 1 are preferably provided by the rotation angle positions of the rotor 3 being in the form of latching positions, although this is likewise not shown in any more detail in the drawings. Furthermore, a conventional electrical switch, which is not shown in any more detail, can also be accommodated in the housing 12 of the rotary switch 1, and is used as a mains switch for the electrical appliance. This mains switch can expediently likewise be switched by means of the handle 16. A rotary switch 1 such as this can then be used not only to switch the mains voltage but also to produce signal voltages which correspond to the switching positions of the handle 16 and which are used to initiate specific functions of the electrical appliance.

During the assembly of the rotary switch 1, the position of the magnet 4 with respect to the magnetic field sensor 5 is fixed. The signal which is emitted from the magnetic field sensor 5 in the rotation angle positions of the rotor 3 depends on this position. It is admittedly often possible to adjust the null position for the magnetic field sensors 5 digitally, with an appropriate signal being applied after the installation of the magnetic field sensor 5, for zeroing. However, it would then be possible to reproduce reliably only a small number of switching positions owing to the tolerances which occur in the magnetic field sensor 5 in conjunction with mechanical latching of the handle 16, of the shaft 17 and of the rotor 3. According to the invention, the magnet 4 is now arranged such that it can be moved with respect to the rotor 3 in order to adjust its position, in order to compensate for tolerances during assembly. This allows the position of the magnet 4 to be adjusted in one rotation angle position of the rotor 3, so that the magnetic field sensor 5 emits the signal which is associated with the null position.

As can be seen in FIG. 3, the magnet 4 is preferably mounted on the rotor 3 such that it can rotate, in order to adjust its position. A receptacle 20 which faces the magnetic field sensor 5 is located in the rotor 3, for this purpose. It is then also possible for an adjusting means to be arranged between the magnet 4 and the rotor 3, in order to adjust the position of the magnet 4. The adjusting means is in the form of an intermediate piece 21, which is mounted on the rotor 3 such that it can rotate in the receptacle 20. The magnet 4 is once again mounted on the intermediate piece 21.

The magnet 4 is now accessible from the outside of the stator 2, and hence also from the outside of the housing 12, for adjustment. The receptacle 8 which is open on one side 6 is used for this purpose, and at the same time acts as a rotating bearing for the rotor 3 in the stator 2. In addition, there is an aperture 22 in the rotor 3. The aperture 22 extends from that surface of the rotor 3 which faces the open side 6 of the receptacle 8 to the magnet 4 and/or to the intermediate piece 21. A type of Torx, cruciform slot or similar receptacle 23 is located in the magnet 4 and/or in the intermediate piece 21, facing the aperture 21. This allows adjustment via the aperture 22 by means of a tool which engages in the receptacle 23, for example by means of a screwdriver.

After assembly, the rotor 3 is moved to the null position. The tool is then used to rotate the magnet 4, with the rotor 3 fixed in the null position, for example by the latching system, until the magnetic field sensor 5 emits the signal which is associated with the null position. The adjusted position of the magnet 4 is then connected to the rotor 3, such that it cannot rotate. For this purpose, the magnet 4 and/or the intermediate piece 21 can be adhesively bonded, welded, cast or the like to the rotor 3 after adjustment. After this has been done, the handle 16 can then be inserted into the recess 18, after which the aperture 22 is closed.

In another refinement, although this is not shown in any more detail in the drawings, the magnet 4 is not arranged on an intermediate piece 21. In this case, the magnet is composed of a material which has magnetic particles and plastic. This material is molded in the form of a body, which at the same time carries out the respective function of the magnet 4 and of the intermediate piece 21. A body such as this thus at the same time represents the intermediate piece 21 and the magnet 4, thus saving a portion of the production of the rotary switch 1. The body may be produced, for example, by injection-molding from this material.

The invention is not restricted to the described and illustrated exemplary embodiment. Rather, it also covers all specialist developments within the scope of the idea of the invention. The invention may thus be used not only for electrical rotary switches but also for angle and/or rotation encoders, for example for use on machine tools, in motor vehicles or the like.

LIST OF REFERENCE SYMBOLS

1: Electrical rotary switch
2: Stator
3: Rotor
4: Magnet
5: Magnetic field sensor
6,7: Side (of the stator)
8: Receptacle (in the stator)
9: Conductor track
10: Electrical connection (on the stator)
11: Connection (of the magnetic field sensor)
12: Housing
13: Latching/snap-action hook
14: Holder
15: Electronics device
16: Handle
17: Shaft (on the handle)
18: Recess (in the rotor for the shaft)
19: Opening (in the holder)
20: Receptacle (in the rotor for the magnet)
21: Intermediate piece
22: Aperture
23: (Torx/protoform slot) receptacle
24: Bonding wire
25: Surface (in the receptacle)
26: Latching element

The invention claimed is:

1. A device for adjusting rotation angles and capable of functioning as a switch comprising a stator, which has a receptacle which is open on one side and is approximately in the form of a pot, a rotor which is mounted on the stator, which is mounted on a holder with an open side of the stator receptacle facing the holder such that the rotor rotates in the stator receptacle as a rotary bearing between at least two rotation angle positions, a magnet, which moves by means of the rotor, and a magnetic field sensor produces a signal in association with the magnet which signal corresponds to the rotation angle position, wherein 1) the magnetic field sensor is arranged in the stator receptacle on the stator and/or is on a part which is mounted in the stator, such that the stator acts as a mount for the magnetic field sensor, 2) the magnet is arranged on the rotation axis of the rotor, 3) the magnetic field sensor is a Hall sensor, which is two-dimensionally sensitive for magnetic fields parallel to its chip surface, and is mounted on the side of the stator receptacle, which faces away from the open side, and 4) the holder is a printed circuit board.

2. The device for adjusting rotation angles as claimed in claim 1, wherein at least one of the stator and the rotor comprises plastic.

3. The device for adjusting rotational angles as claimed in claim 1 wherein the rotor is located completely in the stator receptacle such that a surface of the stator receptacle, which is located in interior of the stator acts as a rotating bearing.

4. The device for adjusting rotation angles claimed in claim 1, further comprising conductor tracks for electrical connection of the magnetic field sensor located in the stator.

5. The device for adjusting rotation angles as claimed in claim 4, wherein the conductor tracks are a stamped grid composed of metal.

6. The device for adjusting rotation angles as claimed in claim 5 wherein the stamped grid is formed by being injected into the plastic for the injection molded part during the production of the stator.

7. The device for adjusting rotation angles as claimed in claim 4, wherein the conductor tracks are incorporated in the stator in the form of an MID (Molded Interconnected Device) component.

8. The device for adjusting rotation angles as claimed in claim 7 wherein the incorporation in the stator in the form of an MID (Molded Interconnected Device) component is by means of metalized plastic for the conductor tracks.

9. The device for adjusting rotation angles as claimed in claim 4, wherein the magnetic field sensor is an encapsulated chip with connections being soldered to the conductor tracks.

10. The device for adjusting rotation angles as claimed in claim 9 wherein the encapsulated chip with connections is in the form of an SMD (Surface Mounted Device) component.

11. The device for adjusting rotation angles as claimed in claim 4, wherein the magnetic field sensor an unencapsulated chip, with bonding wires.

12. The device for adjusting rotation angles as claimed in claim 11, wherein the bonding wires are welded to the chip at the conductor tracks.

13. The device for adjusting rotation angles as claimed in claim 4 further comprising a printed circuit board provided with a panel for an electrical appliance with the conductor tracks in the stator making contact with the associated conductor tracks on the printed circuit board, and an electronic device for evaluation of the signals produced by the magnetic field sensor, which is located on the printed circuit board.

14. The device for adjusting rotation angles as claimed in claim 4 wherein the position of the conductor tracks extend into the stator receptacle, with the conductor tracks being the part that is mounted in the stator, for arrangement of the magnetic field sensor.

15. The device for adjusting rotation angles as claimed in claim 1, wherein the stator has an exterior, which is a housing.

16. The device for adjusting rotation angles as claimed in claim 15, further comprising an electrical switch located in the housing.

17. The device for adjusting rotation angles as claimed in claim 15, further comprising latching and/or snap-action hooks arranged on the housing in order to mount the stator on a holder with the open side of the stator receptacle facing the holder.

18. The device for adjusting rotation angles as claimed in claim 17, wherein a handle is located on a side of the holder which faces away from the housing, and in that an opening which corresponds to the open side of the receptacle in the stator is located in the holder, through which opening the shaft passes for insertion into the recess.

19. The device for adjusting rotation angles as claimed in claim 1, further comprising on the open side of the stator receptacle, a recess for the insertion of a handle by means of a shaft.

20. The device for adjusting rotation angles as claimed in claim 1, wherein rotation angle positions of the rotor are latching positions.

21. The device for adjusting rotation angles as claimed in claim 1, further comprising an intermediate piece where the magnet is mounted, which intermediate piece is mounted on the rotor, such that it can rotate.

22. The device for adjusting rotation angles as claimed in claim 1 wherein the device is an electrical rotary switch.

23. The device for adjusting rotation angles as claimed in claim 1 wherein the plastic is a thermoplastic or polyamide and the stator and/or the rotor are/is produced as an injection-molded part and the magnet is a cylindrical permanent magnet which is magnetized two-dimensionally or diametrically.

24. The device for adjusting rotation angles as claimed in claim 1 further comprising latching elements which interact between the stator and the rotor such that the rotor is secured in the stator receptacle such that it can not fall out.

25. A device for adjusting rotation angles comprising a stator, which has a receptacle which is open on one side and is approximately in the form of a pot, a rotor which is mounted on the stator such that the rotor rotates in the stator receptacle as a rotary bearing, between at least two rotation angle positions, a magnet, which moves by means of the rotor, and a magnetic field sensor produces a signal in association with the magnet, which signal corresponds to the rotation angle position, wherein 1) the magnetic field sensor is arranged in the stator receptacle on the stator and/or is on a part which is mounted in the stator, such that the stator acts as a mount for the magnetic field sensor, 2) the magnet is arranged on the rotation axis of the rotor, and 3) the magnetic field sensor is a Hall sensor, which is two-dimensionally sensitive for magnetic fields parallel to its chip surface, and is mounted on the side of the stator receptacle, which faces away from the open side, wherein the magnet is adjustable so that its position with respect to the rotor can be varied so as to allow adjustment of the position the magnet when the rotor is in one rotation angle position.

26. The device for adjusting rotation angles as claimed in claim 25, wherein the magnet is mounted in a receptacle on the rotor such that it can rotate, which receptacle faces the magnetic field sensor, in the rotor.

27. The device for adjusting rotation angles as claimed in claim 25, further comprising an adjusting means for adjusting the position of the magnet arranged between the magnet and the rotor.

28. The device for adjusting rotation angles as claimed in claim 27, wherein the adjusting means is an intermediate piece which is mounted in a receptacle on the rotor such that it can rotate, and with the magnet being mounted on the intermediate piece.

29. The device for adjusting rotation angles as claimed in claim 28, wherein the magnet and/or the intermediate piece is connected to the rotor by adhesively bonding, welding or casting after adjustment.

30. The device for adjusting rotation angles as claimed in claim 28 wherein the magnet (4) is composed of a material which has magnetic particles and plastic.

31. The device for adjusting rotation angles as claimed in claim 30, wherein the material being molded is injection molded as the intermediate piece and the magnet.

32. The device for adjusting rotation angles as claimed in claim 25, wherein the magnet is accessible for adjustment from the outside of the stator through the stator receptacle which is open on one side and which stator receptacle is used as a rotating bearing for the rotor.

33. The device for adjusting rotation angles as claimed in claim 32, further comprising an aperture located in the rotor.

34. The device for adjusting rotation angles as claimed in claim 33 wherein the aperture extends from that surface of the rotor which faces the open side of the receptacle to the magnet and/or to the intermediate piece, and in that a slot is located in the magnet and/or in the intermediate piece.

35. The device for adjusting rotation angles as claimed in claim 34, the adjustment is permitted via the aperture by means of a tool which engages in the slot.

36. A device for adjusting rotation angles comprising a stator, which has a receptacle which is open on one side and is approximately in the form of a pot, a rotor which is mounted on the stator such that the rotor rotates in the stator receptacle as a rotary bearing, between at least two rotation angle positions, a magnet, which moves by means of the rotor, and a magnetic field sensor produces a signal in association with the magnet, which signal corresponds to the rotation angle position, wherein 1) the magnetic field sensor is arranged in the stator receptacle on the stator and/or is on a part which is mounted in the stator, such that the stator acts as a mount for the magnetic field sensor, 2) the magnet is arranged on the rotation axis of the rotor, and 3) the magnetic field sensor is a Hall sensor, which is two-dimensionally sensitive for magnetic fields parallel to its chin surface, and is mounted on the side of the stator receptacle which faces away from the open side, wherein the position of the magnet is adjustable relative to the rotor.

* * * * *